US010665766B2

(12) United States Patent
Kums et al.

(10) Patent No.: US 10,665,766 B2
(45) Date of Patent: May 26, 2020

(54) ELONGATED LEAD FRAME AND A METHOD OF MANUFACTURING AN ELONGATED LEAD FRAME

(71) Applicant: SIGNIFY HOLDING B.V., Eindhoven (NL)

(72) Inventors: Gerard Kums, Molenstede (BE); Norbertus Antonius Maria Sweegers, Lierop (NL); Floris Maria Hermansz Crompovets, Bunde (NL); Christian Kleijnen, Ittervoort (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 16/078,688

(22) PCT Filed: Mar. 9, 2017

(86) PCT No.: PCT/EP2017/055534
§ 371 (c)(1),
(2) Date: Aug. 22, 2018

(87) PCT Pub. No.: WO2017/157753
PCT Pub. Date: Sep. 21, 2017

(65) Prior Publication Data
US 2019/0051803 A1 Feb. 14, 2019

(30) Foreign Application Priority Data
Mar. 15, 2016 (EP) ..................................... 16160301

(51) Int. Cl.
*H01L 33/62* (2010.01)
*H05K 1/18* (2006.01)
(Continued)

(52) U.S. Cl.
CPC .......... *H01L 33/62* (2013.01); *H01L 21/4821* (2013.01); *H01L 23/4951* (2013.01);
(Continued)

(58) Field of Classification Search
CPC combination set(s) only.
See application file for complete search history.

(56) References Cited

U.S. PATENT DOCUMENTS

| 3,026,234 A | 3/1962 | Eisler |
| 5,245,215 A * | 9/1993 | Sawaya ............... H01L 23/3107 |
| | | 257/676 |

(Continued)

FOREIGN PATENT DOCUMENTS

| EP | 2845726 A1 | 3/2015 |
| WO | 2005088736 A1 | 9/2005 |

(Continued)

*Primary Examiner* — Quoc D Hoang
(74) *Attorney, Agent, or Firm* — Daniel J. Piotrowski

(57) ABSTRACT

An elongated lead frame (100) for a plurality of solid state light emitters (116), an elongated lighting assembly and a method of manufacturing an elongated lead frame are provided. The elongated lead frame comprises a first patterned layer (310) of an electrically conductive material and a second patterned layer (320) of an electrically isolating material. The first patterned layer comprising two electrically conductive tracks (102) that comprise first structures (316, 316') for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures. The second patterned layer comprising sec- (Continued)

ond structures for a second layer of the stack of the light emitter islands, the second patterned layer is provided on top of the first patterned layer.

13 Claims, 8 Drawing Sheets

(51) Int. Cl.
*H01L 21/48* (2006.01)
*H01L 23/495* (2006.01)
*H01L 25/075* (2006.01)
*H01L 33/56* (2010.01)
*H01L 33/64* (2010.01)
*H05K 3/20* (2006.01)
*F21Y 103/10* (2016.01)
*F21Y 107/70* (2016.01)

(52) U.S. Cl.
CPC .. *H01L 23/49541* (2013.01); *H01L 23/49568* (2013.01); *H01L 23/49575* (2013.01); *H01L 25/0753* (2013.01); *H01L 33/56* (2013.01); *H01L 33/647* (2013.01); *H05K 1/189* (2013.01); *F21Y 2103/10* (2016.08); *F21Y 2107/70* (2016.08); *H05K 3/202* (2013.01); *H05K 2201/066* (2013.01); *H05K 2201/09263* (2013.01); *H05K 2201/10106* (2013.01); *H05K 2201/2009* (2013.01)

(56) References Cited

U.S. PATENT DOCUMENTS

| | | | |
|---|---|---|---|
| 9,530,949 B2 * | 12/2016 | Lee | H01L 33/62 |
| 2013/0188369 A1 | 7/2013 | Chien et al. | |
| 2015/0092413 A1 | 4/2015 | Li et al. | |
| 2015/0129899 A1 | 5/2015 | Speer | |

FOREIGN PATENT DOCUMENTS

| | | |
|---|---|---|
| WO | 2010086034 A1 | 8/2010 |
| WO | 2012127355 A1 | 9/2012 |
| WO | 2014063447 A1 | 5/2014 |
| WO | 2016007683 A1 | 1/2016 |

* cited by examiner

ELONGATED LEAD FRAME AND A METHOD OF MANUFACTURING AN ELONGATED LEAD FRAME

CROSS-REFERENCE TO PRIOR APPLICATIONS

This application is the U.S. National Phase application under 35 U.S.C. § 371 of International Application No. PCT/EP2017/055534, filed on Mar. 9, 2017 which claims the benefit of European Patent Application No. 16160301.4, filed on Mar. 15, 2016. These applications are hereby incorporated by reference herein.

FIELD OF THE INVENTION

The invention relates to an elongated lead frame for a plurality of solid state light emitters, such as, for example, Light Emitting Diodes (LEDs).

The invention further relates to an elongated lighting assembly.

The invention also relates to a method of manufacturing an elongated lead frame for a plurality of solid state light emitters.

BACKGROUND OF THE INVENTION

For car manufacturers it is important to have a signature design for the light sources of the car. Often the light sources comprise a strip shaped light source with Light Emitting Diodes (LEDs) that follows curves in several dimensions, for example, in a first dimension that is defined by a corner of the car and in a second dimension that follows a portion of a partly circular circumference of a front light. Often car manufacturers have to order strip shaped lighting assemblies that are already manufactured in the required shape. There is a need to have a general elongated shaped lighting arrangement that can be bended by the car manufacturer into a specific shape as defined by the design of the light source of a specific car.

Today, in several lighting applications, flexible LED strips are used on which Light Emitting Diodes (LEDs) are provided. The known flexible LED strips use in general a flexible strip-shaped substrate on which power lines are provided to which the LEDs are locally coupled. There may be two power lines and all LEDs may be arranged parallel to each other. The flexible LED strip may also comprise one or more series arrangements of LEDs that are locally coupled in between two main power lines. Then several series arrangements of LEDs are arranged parallel to each other—then the flexible strip has locally tree electrical conductive tracks for transporting electrical energy. The term lead frame may be used for the flexible strip-shaped substrate. In general the term lead frame refers to the metal structure coupled to a semiconductor device that carries the signals and power from the semiconductor device to the outside world. In the context of Light Emitting Diodes (LEDs), the term lead frame refers to the arrangement to which the LEDs are coupled and which carries power and optional signals to the LEDs. Thus, with respect to the known flexible LED strips, the term lead frame refers to the flexible strip-shaped substrate with power lines and electrodes to which the LEDs may be coupled.

In general those flexible strips, which are based on the strip-shaped substrates, are only bendable in one dimension, namely in a direction perpendicular to a plane defined by the flexible strip if the strip is arranged flat—for example, the flexible strip-shaped substrate can be (spirally) coiled up. This flexibility is rather limited and there is a need for more flexible strip-shaped LED lead frames.

The published US patent application US2013/0188369A1 describes a LED 3d curved lead frame of an illumination device. In an embodiment, the 3d curved surface may comprises an elongated stack comprising alternating electrically conductive layers and dielectric layers. The elongated stack locally comprises island structures for receiving a LED and in between the island structures the width of the stack is thinner than at the island structures. In this context it is assumed that the length of the elongated stack is defined from one end of the elongated stack to another end and that the height is defined in a direction from a bottom layer towards a top layer. According to the document, such LED 3d curve lead frames can be bended up to a certain degree such that it can be arranged on a slightly curved surface of an illumination device.

The flexibility of the above discussed flexible LED strips and the LED 3d curved lead frame of the cited US application are limited because 3 conductive layers and 2 isolation layers are stacked or laminated on each other and the flexibility is, for example, not sufficient for the above discussed application in car light sources.

SUMMARY OF THE INVENTION

It is an object of the invention to provide a strip-shaped lead frame for LEDs that is more flexible than the known LED lead frames.

For this purpose, according to an aspect of the invention, an elongated lead frame for a plurality of solid state light emitters is provided.

For this purpose, according to a further aspect of the invention, an elongated lighting assembly is provided.

For this purpose, according to an aspect of the invention, a method of manufacturing an elongated lead frame for a plurality of solid state light emitters is provided.

The elongated lead frame according to one of the aspects of the invention comprises a first patterned layer of an electrically conductive material and a second patterned layer of an electrically isolating material. The first patterned layer comprises two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures. The second patterned layer comprises second structures for a second layer of the stack of the light emitter islands, the second patterned layer is provided on top of the first patterned layer. The plurality of light emitter islands comprise two electrodes for receiving a respective one of the plurality of solid state light emitters and for providing power to the one of the respective one of the plurality of solid state light emitters. The light emitter islands have a rigid structure. The two electrically conductive tracks are arranged along the elongated lead frame for transporting power for the plurality of solid state light emitters. At least one of the two electrically conductive tracks comprises winded portions in between pairs of neighboring light emitter islands for obtaining a flexible electrically conductive track in between the pairs of neighboring light emitter islands.

The method of manufacturing the elongated lead frame comprises i) providing a first patterned layer of an electrically conductive material, the first patterned layer comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures, ii) providing a second patterned layer of an electrically isolating material, the second patterned layer comprising second structures for a second layer of the stack of the light emitter islands, the second patterned layer is provided on top of the first patterned layer.

Optionally, the method comprises iii) providing a third patterned layer of an electrically conductive material, the third patterned layer comprising third structures for a third layer of the stack of the light emitter islands, the third pattern layer is provided on top of a stack formed by the first patterned layers and the second patterned layer.

A hot press lamination process may be applied to a stack of the first patterned layer, the second patterned layer and/or the third patterned layer. If tie bar structures are present, they may be removed of the first patterned layer, the second layer, and/or the third patterned layer.

The elongated lead frame or the manufactured elongated lead frame is more flexible than the known lead frames. One of the two electrically conductive tracks has a winded portion, which implies, for example, that at the winded portion the electrically conductive track follows a longer path than necessary and this additional length of the electrically conductive track is provided as a winded course, e.g. a meandering course, or follows a meandering path, or as windings. The winded portion allows that a length of the one of the two electrically conductive tracks can be easily enlarged or shortened without having the risk that the one of the two electrically conductive tracks breaks. Thus, the winded portion provides additional flexibility to the one of the two electrically conductive tracks such that the elongated lead frame can be bent. In particular, if the elongated lead frame is laid down on a flat surface, the elongated lead frame can at least once be easily bent by bending a portion of the elongated lead frame away from the flat surface, or by creating a bend in the elongated lead frame while the elongated lead frame is still laying on the flat surface. Also, the elongated lead frame can be easily warped, which means, bended around a longitudinal axis of the elongated lead frame.

It is to be noted that the elongated lead frame is relatively flexible and can be bended in several directions and dimensions. Bending means in this context that the shape of the elongated lead frame is altered, but the term "bending" does not directly imply that the elongated lead frame is resilient and has the tendency to move back to its original shape after being bent. In the context of this document it is important that one can easily adapt the shape of the elongated lead frame such that it fits, for example, in curved design of a light source that is curved in multiple dimensions.

The term track in electrically conductive track does not necessarily mean that the track has a certain width compared to its thickness, the electrically conductive tracks may locally have about the same thickness and width, and may locally be relatively wide compared to the thickness of the electrically conductive tracks. For example, the electrically conductive tracks may be relatively wide at the light emitter islands. For example, in between pairs of light emitter islands, the electrically conductive tracks may have about the same thickness and width (which makes this portion relatively flexible in multiple dimensions).

The light emitter islands are relatively stiff, which means that it is difficult to bend. At least they are relatively difficult to bent compared to the area in between two neighboring light emitter islands. For example, each light emitter island may be provided with a stiffener, which is a layer that is made of a rigid material. This document provides also an alternative embodiments for obtaining a relatively stiff light emitter island.

The elongated lead frame has two electrically conductive tracks that are arranged along the elongated lead frame for transporting power. It is to be noted that embodiments of the elongated lead frame are not limited to exactly two electrically conductive tracks that transport power. There may be more electrically conductive tracks that transport power if, for example, solid state light emitters of different colors are used and which have to receive independently from each other a power signal.

Optionally, also another one of the two electrically conductive tracks comprises winded portions in between the pairs of neighboring light emitter islands for obtaining two flexible electrically conductive tracks in between the pairs of neighboring light emitter islands. This optional feature increases the flexibility of the elongated lead frame.

It is noted that in between two neighboring islands, the two electrically conductive tracks are not mechanically coupled to each other by means of a rigid material. If the two electrically conductive tracks would be mechanically coupled to each other by a rigid material, such as a substrate, than the flexibility of the elongated lead frame would be strongly limited despite the winded portions. Additionally, because the two electrically conductive tracks are not mechanically coupled to each other by means of a rigid material, they can move independently of each other in between two neighboring light emitter islands and, thus, if the elongated lead frame is bended in a certain direction or warped around its central axis. In an embodiment the tracks and other part of the elongated lead frame are encapsulated in a flexible material, but this flexible material will not create mechanical stress in one of the two electrically conductive tracks if one of the tracks has to bend more than the other track.

Optionally, the third patterned layer comprises a plurality of series electrically conductive wires. Each series electrically conductive wire is coupled between a first light emitter island and a neighboring second light emitter island for providing an electrical connection in a series arrangement of a subset of the plurality of solid state light emitters. The series electrically conductive wires are arranged near or at a longitudinal central axis of the elongated lead frame. Often a few solid state light emitters are coupled in series and the series arrangements are coupled parallel to each other. In such an arrangement an additional wire is required between some of the pairs of light emitter islands. This optional embodiment provides the series electrically conductive wires which allow any combination of series and parallel arrangements of solid state light emitters. The series electrically conductive wires are arranged near or at a longitudinal central axis of the elongated lead frame. This results in the fact that, if the elongated lead frame is bent, the series electrically conductive wires have only to bend a little bit. Thereby it is prevented that the series electrically conductive wires will easily break and it is prevented that the series electrically conductive wires reduce the flexibility of the elongated lead frame too much.

Instead of "the series electrically conductive wires are arranged near or at a longitudinal central axis of the elongated lead frame" one may also read: each series electrically conductive wire starts at a first middle location of the first light emitter island and ends at a second middle location of the second light emitter island and follows a substantially straight path. The first middle location and the second middle location are arranged at a central position of the ends of the first light emitter island and the second light emitter island that face each other seen along a longitudinal axis of the elongated lead frame.

Optionally, the plurality of series electrically conductive wires have a central portion at which a width of a respective series electrically conductive wire is about equal to a height of the respective series electrically conductive wire. If a wire has a width and height that are about equal to each other, they can be easily bent in multiple directions without having the risk that the wire breaks. As such the central portions of the plurality of series electrically conductive wires contribute to the flexibility of the elongated lead frame. Optionally, for at least a subset of the plurality of series electrically conductive wires, the whole series electrically conductive wire has a height and width that are about equal to each other in between the respective two neighboring light emitter islands. In this optional embodiment the term "about equal" is used, which means that the width and height do not deviate more than 20% from each other, or, optionally, not more than 10% from each other, or, optionally, not more than 5% from each other.

Optionally, the plurality of the light emitter islands are formed by stacks of a first patterned layer, the electrically isolating second patterned layer and the third patterned. The first layer comprises first structures, which may be substantially rectangular areas, but other forms are possible. The third layer comprises third structures, which may be substantially rectangular areas. At least two of the substantially rectangular areas form the two electrodes for receiving one of the plurality of solid state light emitters.

Thus, the first structures are arranged at a first surface of the electrically isolating layer and the third structures are arranged at an opposite second surface of the electrically isolating layer. Optionally, the first structures cover about the whole first surface of the electrically isolating layer within an island, wherein the term 'about the whole' must be read as 'at least 90% of' or 'at least 95% of'. Optionally, the third structures cover about the whole second surface of the electrically isolating layer, within an island, wherein the term 'about the whole' must be read as 'at least 90% of' or 'at least 95% of'.

In this optional embodiment, the light emitter islands are formed by a three layer stack. Such a three layer stack is relatively stiff and thereby it provides the rigid structure of the light emitter islands. Consequently, the light emitter island is well suitable for coupling a solid state light emitter to the electrodes and because of the relatively stiff structure, the risk that a connection between a solid state light emitter and the electrodes breaks is relatively low if the elongated lead frame is bent. Also the first layer and the third layer comprise several metal areas and thereby the heat generated in the solid state light emitters is well spread along the light emitter island and consequently the heat can be well transferred to the ambient of the elongated lead frame.

According to this optional embodiment, also the first structures and the third structures can be made relatively large, even if the elongated lead frame comprises structures that are suitable for creating a plurality of series arrangement of solid state light emitters that are subsequently coupled parallel to each other. Large first and third structures mean that the heat is better spread and the solid state light emitters are better cooled. In traditional elongated lead frames, the electrodes and electrical connections for the series arrangements must be made within the same layer as the layer in which the two electrically (power) connections are provided. Then the size of the electrodes is limited compared to the size of the elongated lead frame because some space must be available for the two electrical (power) connections. According to this embodiment, the functions of the electrodes and two electrically conductive tracks are separated from each other such that in each first layer and third layer the first and second structures can be made, given the maximum dimensions of the light emitter islands, as large as possible to obtain a better heat management.

Optionally, the electrically isolating layer and/or the first layer may have a through hole or recess arranged near a center of respective layers in which, for example, the solid state light emitter may be provided (which is coupled to the two second areas).

Optionally, the first structures are electrically isolated from each other by a first elongated area extending in a first direction within the first layer and the third structures are electrically isolated from each other by a second elongated area extending in a second direction within the second layer. The second direction is different from the first direction. Optionally, the second direction is perpendicular to the first direction. This optional embodiment contributes to the stiffness of the light emitter islands. Assume one has an electrically isolating layer to which, at one side, two structures are provided that are separated by the first elongated area, then it may be relatively easy to bent the stack of the electrically isolating layer with the two metal areas along the elongated area. By providing at an opposite surface of the electrically isolating layer also two structures that are separated from each other by the second elongated area that is oriented in another direction than the first elongated area, the bending of the light emitter island along the first elongated area is prevented and along the second elongated area is prevented.

The first elongated area and the second elongated area may be provided with an additional electrically isolating material. The first elongated area and the second elongated area may also be "empty", which means that they are in direct contact with the ambient air (for example, for cooling). The first elongated area and the second elongated area may be rectangular shaped or line shaped. At a central location of the first elongated area and/or of the second elongated area, the respective first and/or second elongated area may have a locally widened portion (e.g. provided with a dilatation) and the solid state light emitter may be provided in the locally widened portion.

Optionally, if the elongated lead frame comprises the plurality of series electrically conductive wires, the plurality of series electrically conductive wires are each coupled between one of the second metal areas of the first light emitter island and one of the second metal area of the neighboring second light emitter island. Thus, the second areas are part of the series connections that are created by the series electrically conductive wire. More specifically, in this optional embodiment, for each light emitter island, two of the second areas form the two electrodes for receiving the light emitter.

Optionally, the elongated lead frame also comprises a plurality of through holes in a subset of the electrically isolating layers of the stacks of the plurality of light emitter islands. The through holes are filled with an electrically conductive material for electrically connecting one of the second metal areas with one of the first metal areas. The through holes are used to create the electrical connection with the two electrically conductive tracks that provide the power. Each series arrangement of light emitters may have a first through hole at a first light emitter island and may have a second through hole at a second light emitter island.

Optionally, the electrically conductive material is ohmic for creating a series resistor. If several series arrangements of light emitters are coupled parallel to each other, it is advantageous to use in each series arrangement a series resistor. The through holes that are filled with the electrically conductive material are useful locations to create such series resistors by providing ohmic material in the through holes. Thereby no additional components need to be provided in on at the elongated lead frame. The electrically isolating layer may be relatively thin and then an ohmic material with a relatively high resistance has to be used to obtain a suitable series resistor.

Optionally, the stacks of the plurality of light emitter islands further comprise a further electrically isolating layer and a further metal element. The further electrically isolating layer is provided in between the further metal element and one of the first patterned layer and the third patterned layer. The further metal element is one of a flat metal element that has an area that is coupled to the further electrically isolating layer, or a metal element bended in a U shape that has in between the legs of the U shape a flat area that is coupled to the further electrically isolating layer. For example, the legs of the U shape are straight, or the legs of the U shape are curved. The legs of the U shape may be specularly reflective and may act as an optical element that influences the light beam emitted by light emitter that is received by the electrodes of the light emitter island.

The further metal element provides an additional heat sink to the light emitter island and thereby the heat management of the light emitter islands is improved and more heat can be provided, in use, to an ambient of the elongated lead frame that is provided with light emitters. Further advantage of the further metal element is that they may also be arranged to act as an optical element such that it fulfills the function of a reflector and of a heat sink. Alternatively, parts of the further metal elements that protrude away from the elongated lead frame may also be used to fasten the elongated lead frame to other devices, for example, by clamping the parts of the further metal elements in between other elements of the device, or using a screw to faster the further metal element to the device, etc. The further metal element is electrically isolated from the first layer and the second layer such that it does not conduct a current or has a (too high) voltage. As such the further metal element can be touched by users or may be connected to other devices without forming a safety risk.

Optionally, at least one of the second patterned layer and the further electrically isolating layer is heat conductive. In other words, the one of the electrically isolating layer and the further electrically isolating layer does not act as a heat isolator and allows the transportation of heat between different layers of the stacks of the light emitter islands. Thereby heat generated in the light emitter is better spread along the light emitter island and the heat can be better provides to an ambient of the elongated lead frame.

According to an aspect of the invention, an elongated lighting assembly is provided that comprises a plurality of solid state light emitters and an elongated lead frame according to one of the above discussed embodiments. The solid state light emitters are each arranged at the two electrode of a respective one of the light emitter islands.

Optionally, the elongated lighting assembly further comprises a light transmitting flexible material encapsulating the elongated lead frame provided with the solid state light emitters. The light transmitting flexible material is shaped in a bar-share or a rod-shape. The light transmitting flexible material is also provided in a space in between pairs of neighboring light emitter island in between the two electrically conductive tracks. If the elongated lighting assembly comprises further metal elements, the further metal elements may partially protrude out of the light transmitting flexible material. The light transmitting flexible material acts as a sort of casing or housing of the elongated lighting assembly. Thereby the elongated lead frame is protected and users can not directly touch the solid state light emitters and/or the electrically conductive tracks. Thereby the elongated lead frame is made safer. Furthermore, the light transmitting flexible material provides flexibility and also limits, up to a limited degree, the flexibility of the elongated lighting assembly thereby preventing that the elongated lighting assembly can be bended too much, for example, to such an extent that, although the elongated lead frame is very flexible, one of the electrically conductive tracks or wires breaks. The light transmitting flexible material distributes the mechanical stresses induced by the bending and avoids that all bending is located in one place (i.e. it avoids that corners arise). The light transmitting flexible material may also contribute to a light mixing of the light emitted by the different solid state light emitters, such that a more homogeneous light emission is obtained. Optionally, the light transmitting flexible material may also be provided with light spreading particles that, for example, diffusely reflect light that impinges on them. Optionally, the light transmitting flexible material may also be provided with luminescent particles for controlling a color of light emitted by the elongated lighting assembly. A suitable material for the light transmitting flexible material is Silicone or a rubber-like material that is at least light transmitting. Light transmitting includes translucent and transparent. The parts of the further metal elements that partially protrude out of the light transmitting flexible material conduct heat from solid state light emitters towards the air outside the light transmitting flexible material. Note that the parts that protrude out of the light transmitting flexible material is electrically isolated from the circuit of the elongated lighting assembly and is, therefore, electrically neutral.

According to an aspect of the invention, a method of manufacturing an elongated lead frame for a plurality of solid state light emitters is provided. The method comprises: a) providing a first patterned layer of an electrically conductive material, the first patterned layer comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures; b) providing a second patterned layer of an electrically isolating material, the second patterned layer comprising second structures for a second layer of the stack of the light emitter islands, the second patterned layer is provided on top of the first patterned layer.

Optionally, the method comprises c) providing a third patterned layer of an electrically conductive material, the third patterned layer comprising third structures for a third layer of the stack of the light emitter islands, the third pattern layer is provided on top of a stack formed by the first patterned layers and the second patterned layer, d) applying a hot press lamination process to a stack of the first patterned layer, the second patterned layer and the third patterned layer, and e) removing tie bar structures of the first patterned layer, the second layer and/or the third patterned layer.

Further preferred embodiments of the device and method according to the invention are given in the appended claims, disclosure of which is incorporated herein by reference.

BRIEF DESCRIPTION OF THE DRAWINGS

These and other aspects of the invention will be apparent from and elucidated further with reference to the embodiments described by way of example in the following description and with reference to the accompanying drawings, in which FIG. 1a schematically shows a top view of an embodiment of an elongated lead frame, FIG. 1b schematically shows a top view of a further embodiment of an elongated lead frame, FIG. 2 schematically shows bending direction of, for example, the elongated lead frame, FIG. 3 schematically shows an exploded view of another embodiment of an elongated lead frame, FIG. 4 schematically shows a three dimensional view of an embodiment of an elongated lighting assembly, FIG. 5 schematically shows a cross sectional view of an embodiment of a light emitter island that comprises a stack with a further electrically isolating layer and a further metal element, FIGS. 6 and 7 schematically present three dimensional views of embodiments of elongated lighting assemblies, FIG. 8 schematically shows a three dimensional view of an embodiment of an elongated lighting assembly that comprises a light transmitting flexible material, FIGS. 9a to 9c schematically present three dimensional views of embodiment of elongated lighting assemblies having differently shaped further metal elements, FIGS. 10 to 14 schematically present different intermediate states of a method of manufacturing an elongated lead frame, and FIG. 15 schematically presents a method of manufacturing an elongated lead frame.

The figures are purely diagrammatic and not drawn to scale. In the Figures, elements which correspond to elements already described may have the same reference numerals.

DETAILED DESCRIPTION OF EMBODIMENTS

Figure 1A:
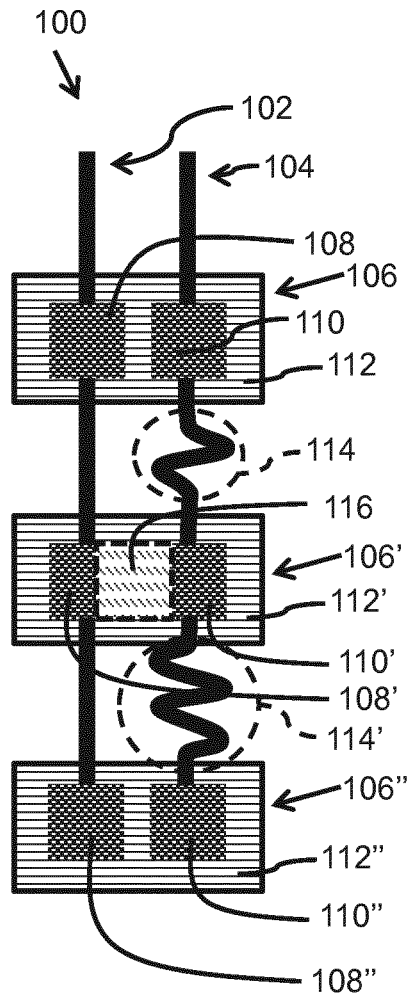

FIG. 1a schematically shows a top view of an elongated lead frame 100 for a plurality of solid state light emitters 116. The elongated lead frame 100 comprises a plurality of light emitter islands 106, 106', 106" that comprise two electrodes 108, 110, 108', 110', 108", 110". Each light emitter island 106, 106', 106" has a rigid structure. In the embodiment of FIG. 1a, the rigid structure is provided by stiffeners 112, 112', 112" that are formed by a plate of an electrically isolating material. The plate is made out of a relatively stiff material that is difficult to bend. On the stiffeners 112, 112', 112" are provided the two electrodes 108, 110, 108', 110', 108", 110". Each pair of electrodes 108, 110, 108', 110', 108", 110" is for receiving a solid state light emitter 116. For example, one solid state light emitter 116 is schematically drawn and indicated with number 116. The elongated lead frame comprises a first patterned layer with two electrically conductive tracks 102, 104 for providing power to the solid state light emitters 116. Electrically conductive track 102 comprises the electrodes 108, 108', 108" and straight electrically conductive tracks/wires in between pairs of neighboring light emitter islands 106, 106', 106". Electrically conductive track 104 comprises the electrodes 110, 110', 110" and electrically conductive tracks/wires in between pairs of neighboring light emitter islands 106, 106', 106". In particular electrically conductive track 104 comprises portions 114, 114' in between pairs of neighboring light emitter islands 106, 106', 106" where the electrically conductive track 104 has a winded portion 114, 114', which means that the electrically conducive track 104 comprises a few windings or follow a winded course at the winded portions 114, 114'. As shown in FIG. 1a, the winded portions 114, 114', may have a few windings as shown at winded portion 114, but may also have a larger number of windings as shown at winded portion 114'. The exact number of windings is not important—it is important that the winded portion 114 provides a flexibility and based on the required flexibility and the stiffness of the electrically conductive track itself an appropriate number of windings may be provided. Basically, the electrically conductive track 104 is in between pairs of neighboring light emitter islands 106, 106', 106" longer than the shortest distance between the neighboring light emitter islands 106, 106', 106". These longer portions of the electrically conductive track 104 and the windings allows that the distance between pairs neighboring light emitter islands 106, 106', 106" is made longer or shorter at the winded portions 1145, 114' of the electrically conductive track 104 without breaking the electrically conductive track 104 and, thus, a flexibility is introduced which allows the bending of the elongated lead frame in several directions.

Figure 1B:
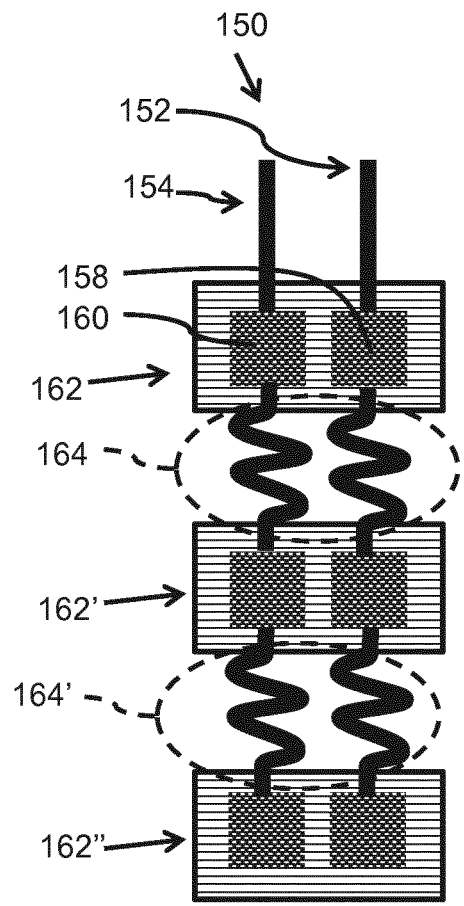

FIG. 1b schematically shows another embodiment of the elongated lead frame 150. Elongated lead frame 150 comprises light emitter islands 162, 162', 162" and two electrically conductive tracks 152, 164. Each light emitter island 162, 162', 162" comprises two electrodes 158, 160 for receiving power and connecting to a solid state light emitter. The electrodes 158, 160 are part of the respective electrically conductive tracks 152, 154. In between pairs of neighboring light emitter islands 162, 162', 162" both electrically conductive tracks 152, 154 have winded portions 164, 164' where said electrically conductive tracks 152, 154 each have a plurality of windings or follow a winded course.

It is to be noted that the two electrically conductive tracks 152, 154 are at the winded portions 164, 164', which means at areas in between pairs of neighboring light emitter islands 162, 162', 162", not mechanically coupled to each other by means of a rigid/stiff material. This means that, for example, air is in between them, or that they are coupled to each other by means of a flexible material. Thereby it is allowed that one of the winded portions in between a specific pair of neighboring light emitter islands may be bent or may be (de-)formed in another shape independently of the bending/deformation of the other one of the winded portions in between the specific pair of neighboring light emitter islands. Thereby, the regions in between pairs of neighboring light emitter islands have a high flexibility and, as such, the elongated lead frame 150 is relatively flexible. This reasoning also applies to the two electrically conductive tracks 102, 104 of FIG. 1. In between pairs of neighboring light emitter islands 106, 106', 106" the first electrically conductive track 102 is not mechanically coupled to the winded portions 114, 114' of the second electrically conductive track 104. Thereby the areas in between the pairs of neighboring light emitter islands 106, 106', 106" have a high flexibility and thereby the elongated lead frame 100 is relatively flexible.

Suitable materials for the two electrically conductive tracks and electrodes are copper, copper alloys, iron/nickel alloys or aluminum.

Discussed characteristics of the above discussed elongated lead frames 100, 150 do also apply to the embodiments of the hereinafter discussed elongated lead frames unless it is explicitly stated that the hereinafter discussed elongated lead frames have other, additional or alternative characteristics.

Figure 2:
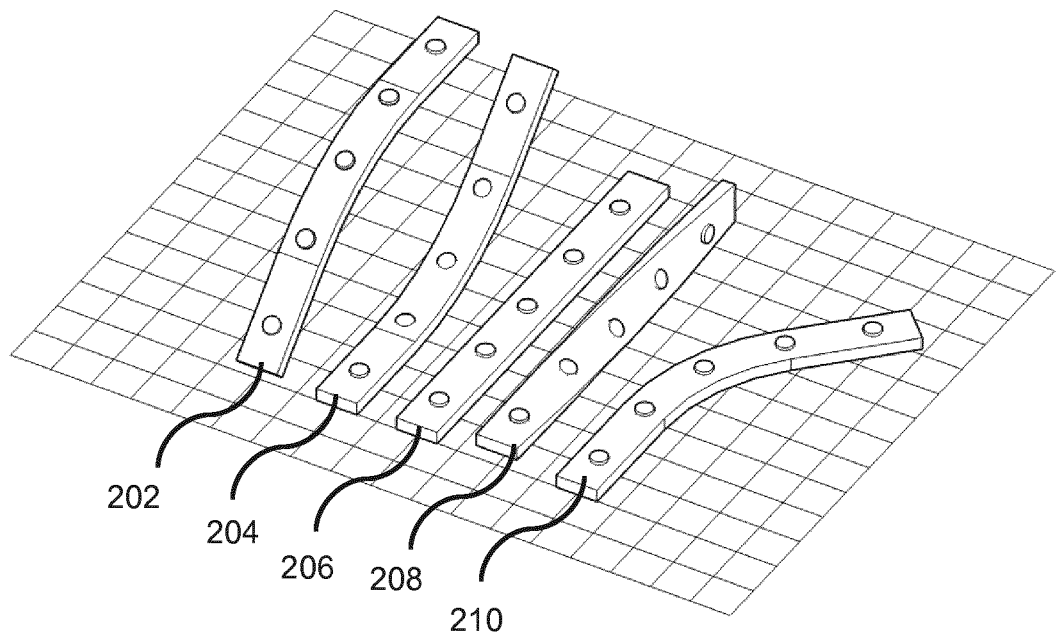

In FIG. 2 an elongated lighting assembly 206 that comprises solid state light emitters is drawn in a flat plane. Elongated lighting assembly 206 is not bended. The elongated lighting assembly 206 may comprise the elongated lead frame 100 or 150 of FIG. 1a or 1b. FIG. 2 shows the flexibility of the elongated lead frames 100, 150. As shown with elongated lighting assembly 202, 204, the elongated lead frames 100, 150 can be bended such that they form a curve in a plane that is perpendicular to the plane of the flat elongated lighting assembly 206. As shown with elongated lighting assembly 208, the elongated lead frames 100, 150 can be warped, which means that it can be turned around its central longitudinal axis. As shown with elongated lighting assembly 210, the elongated lead frames 100, 150 can be bended such that they form a curve in the plane defined by the flat elongated lighting assembly 206. The bending of the elongated lead frames 100, 150 may also be a combination of the shown configurations 202, 204, 208, 210. Thus, the elongated lead frames 100, 150 are well suitable for use in luminaires of cars wherein, for example, a lighting strip must be provided along a specifically curved track around, for example, a headline of the car.

Figure 3:
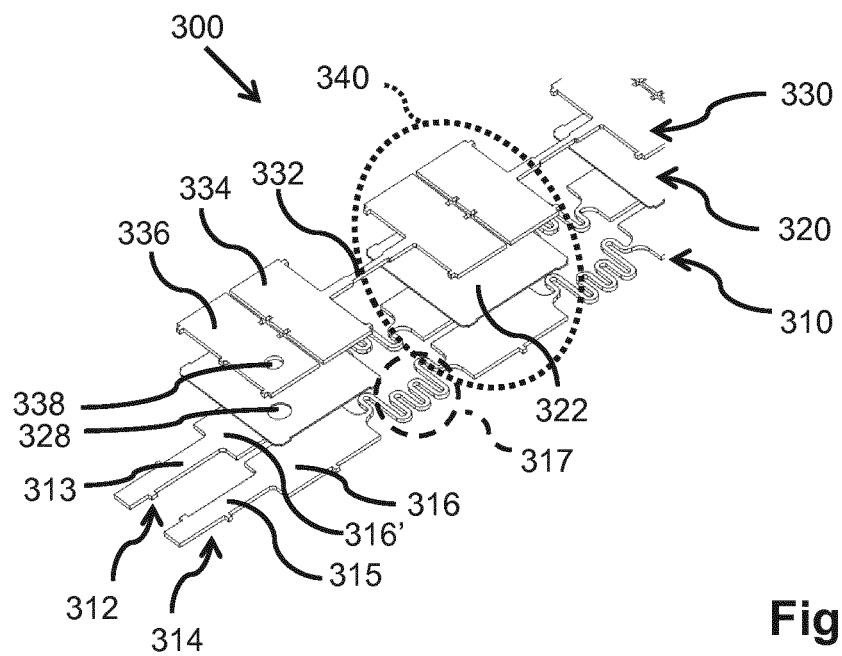

FIG. 3 schematically shows in an exploded view another embodiment of an elongated lead frame 300. FIG. 3 presents an exploded view of the elongated lead frame of the elongated lighting assembly 400 of FIG. 4. The light emitter islands of the elongated lead frame 300 are formed by a stack 340 of layers. The stack 340 of layers comprises a first metal layer 310 in which first areas 316, 316' are formed and that comprises the winded portions 317. The electrically conductive tracks 312, 314 are provided in the first metal layer 310 and the electrically conductive tracks 312, 314 comprise respective first areas 316, 316' and respective winded portions 317. In FIG. 3 it can be seen that the winded portions 317 have a metal track that follows a winded course, in other words, a meandering course. The stack of layers 340 further comprises an electrically isolating layer 320 that comprises, at the light emitter islands, an electrically isolating pad 320 that is provided on the first areas 316, 316'. The electrically isolating pads 320 may be manufactured of a heat conductive electrically isolating material. The stack of layers 340 further comprises a second metal layer 330 that comprises second area 334, 336 at the light emitter islands and series electrically conductive wires 332 in between pairs of light emitter islands. The second areas 334, 336 are provided on the electrically isolating pad 322 at an opposite surface of the electrically isolating pad 322 than the surface to which the first areas 316, 316' are provided.

The electrically isolating layer 320 and the electrically isolating pad 320 may be made of a dielectric material. However, embodiments of these elements are not limited to material that have all the characteristics of the dielectric material because it is only relevant that the layer 320 and pad 322 are electrically isolating.

The series electrically conductive wires 332 have at least a portion where the height of the series electrically conductive wires 332 is about equal to the width of the series electrically conductive wires 332. The height being about equal to the width means that the height does not deviate more than 20% from the width, or, optionally, does not deviate more than 10% from the width, or, optionally, does not deviate more than 5% from the width. Thereby the series electrically conductive wires 332 have a central portion that can be bent thereby contributing the flexibility of the elongated lead frame 300. The series electrically conductive wires 332 are arranged close to a central longitudinal axis of the elongated lead frame 300 such that they have to bend only a little bit when the whole elongated lead frame 300 is bent. The series electrically conductive wires 332 is coupled to one of the second areas 334, 336 of a first light emitter island and is coupled to one of the second areas of a neighboring second light emitter island. Respective second areas of neighboring light emitter islands that face each other are coupled to each other via the series electrically conductive wires 332 and the series electrically conductive wires 332 are attached to these respective second areas at the edges of the areas that face each other and, more in particular, at about central position of these edges.

It can also be seen in FIG. 3 that the width and the height of the two electrical conductive tracks 312, 314 in the winded portions 317 are also about equal to each other for obtaining enough flexibility in each one of the winded portions 317. At the light emitter islands, the two electrical conductive tracks 312, 314 each comprise one of the first areas 316, 316' and, thus, the height and the width are different at the light emitter islands, namely, the height is smaller than the width and smaller than a length. The two electrically conductive tracks 312, 314 also comprise at at least one end of the elongated lead frame 300 external connector pins 313, 315 what are suitable for connecting the elongated lead frame 300 to an external power source.

As can be seen in FIG. 3, the first areas 316, 316' are separated from each other by means of a first elongated area. The first elongated area may be filled with ambient air, a (non-electrically conductive) material that is provided around the whole elongated lead frame 300, or any other appropriate dielectric/electrically isolating material. The second areas 334, 336 are separated from each other by means of a second elongated area. The second elongated area may also be filled with ambient air, a (non-electrically conductive) material that is provided around the whole elongated lead frame 300, or any other appropriate dielectric/electrically isolating material. In the example of FIG. 3 the direction of the first elongated area is perpendicular to the direction of the second elongated area. In general the directions should be different. The effect of the different directions of the first and second elongated areas is that the stacks of layers at the light emitter islands are relatively stiff and cannot easily be bent. Thereby the second areas 334, 336 of each light emitter island are well suitable for being coupled to at least one solid state light emitter and because of the relatively rigid light emitter islands, the risk that a solid state light emitter disengages from the second areas 334, 336 is relatively small.

As can be seen in FIG. 3, there may also be provided through holes 328 in the electrically isolating pads 322 of some of the stacks of the light emitter islands. The through hole may be filled with an electrically conductive material to connect one of the second areas 336 with one of the first area 316. As can be seen in FIG. 3, a through hole 338 may also be provided in respective second area 336 such that the electrically conductive material can be easily provided in the through hole 328 after manufacturing the elongated lead frame 300. By selectively creating through holes 328 and selectively providing series electrically conductive wires 332, one can couple a series arrangement of a specific number of solid state light emitters to the two electrically conductive wires that provide the power for the solid state light emitters. When several series arrangements of solid state light emitters are coupled in parallel to each other, it is advantageous to use series resistors in the series arrangements. Optionally, some of the through hole 328 may be filled with a high ohmic electrically conductive material to obtain a series resistor for a series arrangement of solid state light emitters.

Suitable materials for the first layer 310 and/or second layer 330 are copper, copper alloys, iron/nickel alloys or aluminum. Suitable materials for the second layer 320, such as for the electrically isolating pads 322, are polyimide, polyesters and/or epoxies. However, embodiments are not limited to these examples. It is important that the first layer 310 and the second layer 330 are made of an electrically conductive material and the second layer 320 is made of an electrically isolating material.

Figure 4:
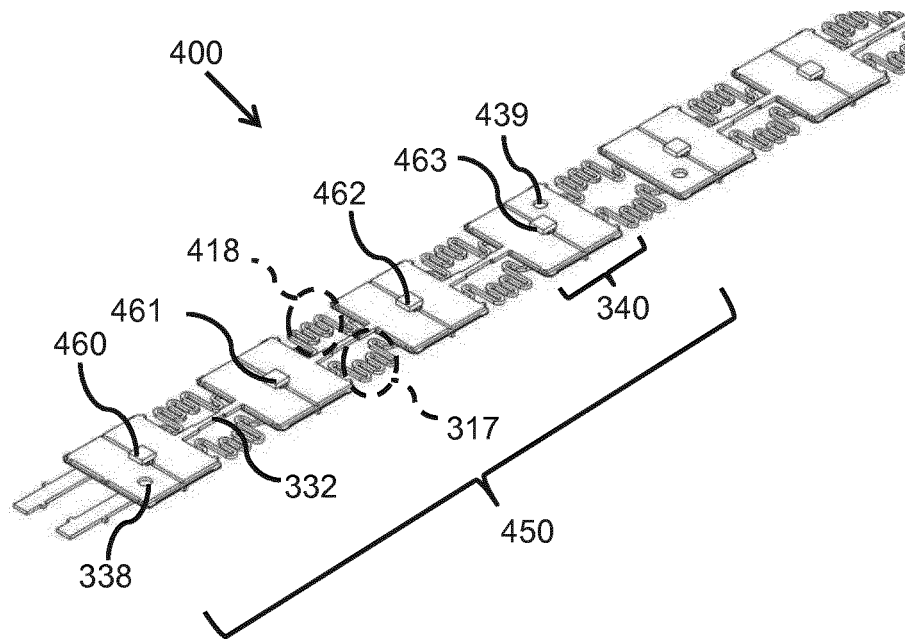

FIG. 4 schematically shows a three dimensional view of an elongated lighting assembly 400 that comprises the elongated lead frame 300 of FIG. 3. By means of 340 one of the stacks of layers of one of the light emitter islands is indicated. As can be seen a first one of the two electrically conducive wires has winded portions 317 in between pairs of neighboring light emitter islands and a second one of the two electrically conductive wires has winded portions 418 in between pairs of neighboring light emitter islands. In FIG. 4 several solid state light emitters 460, 461, 462, 463 are coupled to the second areas of the second layers of the light emitter islands. The solid state light emitters 460, 461, 462, 463 are coupled in a series arrangement 450 via a plurality of series electrically conductive wires provided between the second areas to which the solid state light emitters 460, 461, 462, 463 are coupled. At the beginning of the series arrangement 450 a through hole 338 is provided in which electrically conductive material is provided to couple the beginning of the series arrangement to one of the two electrically conductive wires. At the end of the series arrangement 450 a through hole 439 is provided in which electrically conductive material is provided to couple the end of the series arrangement to another one of the two electrically conductive wires.

Figure 5:
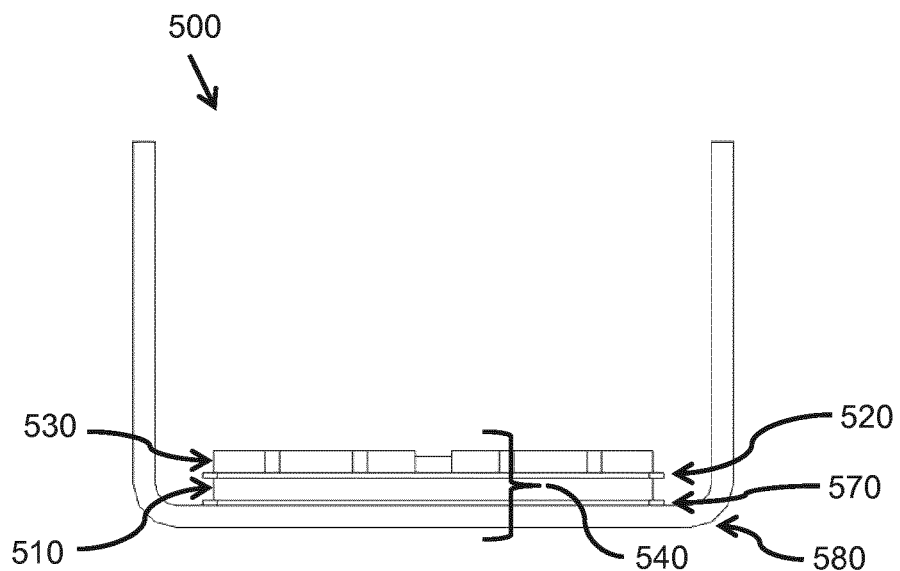

FIG. 5 schematically shows a cross sectional view of an embodiment of a light emitter island 500 that comprises a stack 540 with a further electrically isolating layer 570 and a further metal element 580. As discussed in the context of FIGS. 3 and 4, in embodiments of the elongated lead frame 300, 400, the light emitter island 340 may at least comprise a first metal layer 310 (which comprises the first areas 316, 316'), an electrically isolating layer 320 and a second metal layer 330 (which comprises the second areas 334, 336). In the embodiment of FIG. 5, the stack 540 of the light emitter islands comprises the first metal layer 510 (which may comprise first areas), the electrically isolating layer 520 and the second metal layer 530 (which may comprise the second areas), the further metal element 580 and the further electrically isolating layer 570 that is sandwiched between the further metal element 580 and the first metal layer 510. The further electrically isolating layer 570 may locally comprise an electrically isolating pad that is sandwiched in between the further metal element 580 and the first metal layer 510. In another embodiment, the layers of the stack 540 have slightly different order (seen from top to bottom in the configuration of FIG. 5): the first metal layer, the electrically isolating layer, the second metal layer, the further electrically isolating layer, the further metal element.

The further metal element 580 of FIG. 5 has a U shape. A base portion of the U is relatively flat and is arranged in contact with the further electrically isolating layer 570. The legs of the U shaped further metal element 580 are relatively straight. As will be seen later, the legs of the U shaped further metal element 580 may also have another shape, for example, a curved shape. The further metal element 580 may also be provided with a reflective coating, for example, a diffusely reflective coating or a specularly reflective coating, such that the legs of the U shaped further metal element 580 act as an optical element influencing a light beam emitted by a solid state light emitter that may be provided, in use, on the second metal layer 530 and that emits, in use, light in an upwards direction (as seen in the orientation of FIG. 5). In the example of FIG. 5, the legs of the U shaped further metal element 580 act as a collimator.

The U shaped further metal element 580 is electrically isolated by the further electrically isolating layer from the first metal layer and/or the second metal layer. As such the U shaped further metal element 580 is an element that may be touched, in use, by user because it does not conduct a current or has a (too) high voltage. Because the U shaped further metal element 580 is electrically neutral it can also be brought in contact with parts of a device or an apparatus in which the elongated lead frame or elongated lighting assembly is integrated for example for fastening the elongated lead frame or elongated lighting assembly, but also for transferring heat to cooling elements.

Optionally, the further electrically isolating layer 570 may be heat conductive. If the further electrically isolating layer is relatively thin, a relatively large amount of heat can be transported towards the U shaped further metal element 580. Alternatively, if the further electrically isolating layer is somewhat thicker, but has a good heat conductivity coefficient, quite a lot of heat can also be transported towards the U shaped further metal element 580. Then the U shaped further metal element 580 is well able to conduct, in use, the heat away from the elongated lead frame and to transfer, in use, the heat towards the environment of the elongated lead frame/the elongated lighting assembly.

Figure 6:
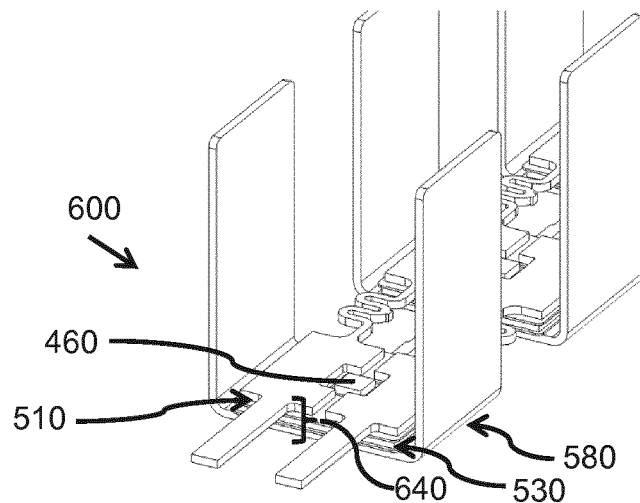
Figure 7:
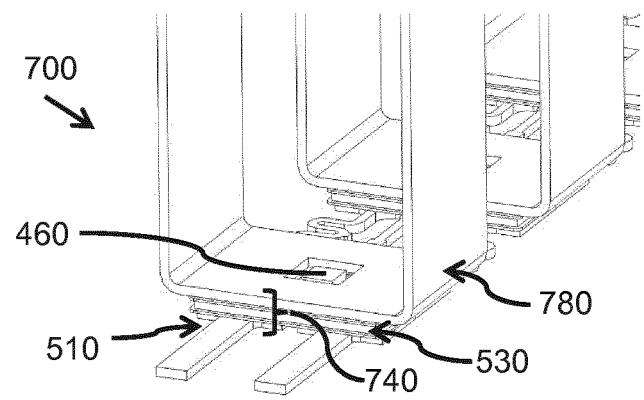

FIGS. 6 and 7 schematically present three dimensional views of portions of embodiments of elongated lighting assemblies 600, 700. In the elongated lighting assemblies an elongated lead frame is used that is, for example, similar to the elongated lead frame 300 of FIG. 3 and each light emitter island is provided with a solid state light emitter 460, for example, a Light Emitting Diode (LED). FIGS. 6 and 7 are in particular used to present different arrangements of the layers of the stacks 640, 740 of the light emitter islands and how the solid state light emitters 460 can be arranged on the light emitter islands.

In FIG. 6 the stack 640 of layers of the light emitter islands comprises, seen from bottom to top (as seen in the orientation of FIG. 6): a first metal layer 510 (having at the light emitter islands two first areas), an electrically isolating layer, a second metal layer 530, a further electrically isolating layer, and a further metal element 580. The further metal element 580 is similar to the further metal element 580 of FIG. 5. The second metal layer 530 comprises two second areas that form the electrodes to which the solid state light emitter 460 is coupled. To be able to couple the solid state light emitter 460 to the two second areas, a hole is present in the first metal layer 510 (and, thus, recesses in the first areas), and a hole is present in the electrically isolating layer, such that a portion of the second areas is accessible via these holes.

In FIG. 7 the stack 740 of layers of the light emitter islands comprises, seen from top to bottom (as seen in the orientation of FIG. 7): the further metal element 780, the further electrically isolating layer, the second layer 530, the electrically isolating layer, and the first layer 510. A hole is present in the further metal element 780 and the further electrically isolating layer to couple the solid state light emitter 460 to the second areas of the second metal layer 530.

Figure 8:
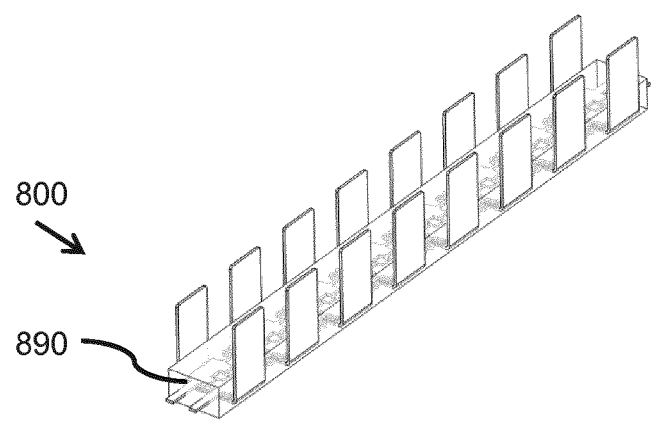

FIG. 8 schematically shows a three dimensional view of an embodiment of an elongated lighting assembly 800 that comprises a light transmitting flexible material 890. The elongated lighting assembly 800 is based on, for example, elongated lighting assembly 600 of FIG. 6 or elongated lighting assembly 700 of FIG. 7. The elongated lighting assembly 800 thus comprises an embodiment of a previously discussed elongated lead frame to which solid state light emitters (for example, Light Emitting Diodes, LEDs) are provided and comprises a bar shaped light transmitting material 890 in which a large portion of the elongated lead frame with solid state light emitters is embedded. About all elements of the elongated lead frame with solid state light emitters are enclosed by the light transmitting material 890 except the legs of the U shaped further metal element. The light transmitting material 890 may be Silicone. In FIG. 8 the light transmitting material 890 is bar shaped, and in alternative embodiments, the light transmitting material 890 is rod shaped. In between the light emitter islands the cross-sectional shape of the bar-shaped or rod-shaped light transmitting material 890 may be different from the cross-sectional shape at the light emitter islands to provide an additional flexibility to the elongated lighting assembly—for example, in between the light emitter islands the rod-shaped light transmitting material 890 has a smaller radius. If the light transmitting material 890 is rod-shaped the cross-sectional shape is not by definition circular. The cross-sectional shape may also be elliptical or egg-shaped to obtain, for example, certain optical effects (e.g. the light transmitting material 890 acts as a lens) The legs of the U shaped further metal element may transport heat towards the ambient of the elongated light transmitting element 800. It is to be noted that the light transmitting flexible material 890 is flexible enough to allow the bending of the elongated lighting assembly in several directions. Because the light transmitting flexible material 890 is also provided in between the winded portions of the two electrically conductive tracks, said respective winded portions are not mechanically coupled to each other by means of a rigid material and thereby it is allowed that one of the winded portions in between a specific pair of neighboring light emitter islands may be bent or may be (de-)formed in another shape independently of the bending/deformation of the other one of the winded portions in between the specific pair of neighboring light emitter islands. Thereby, the regions in between pairs of neighboring light emitter islands have a high flexibility and, as such, the elongated lighting assembly is relatively flexible.

Figure 9A:
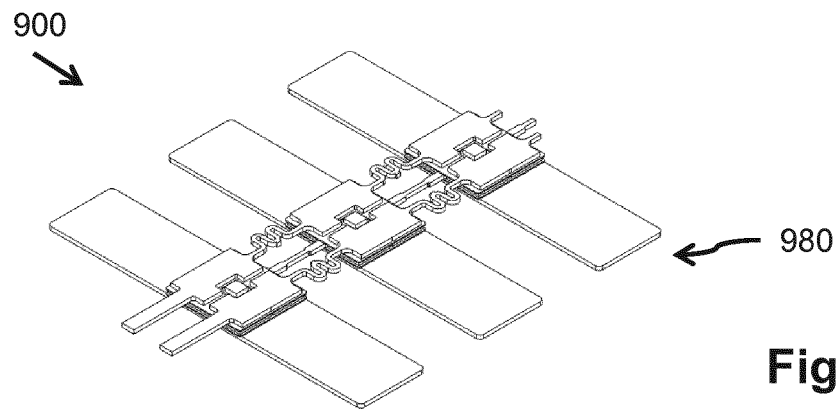
Figure 9B:
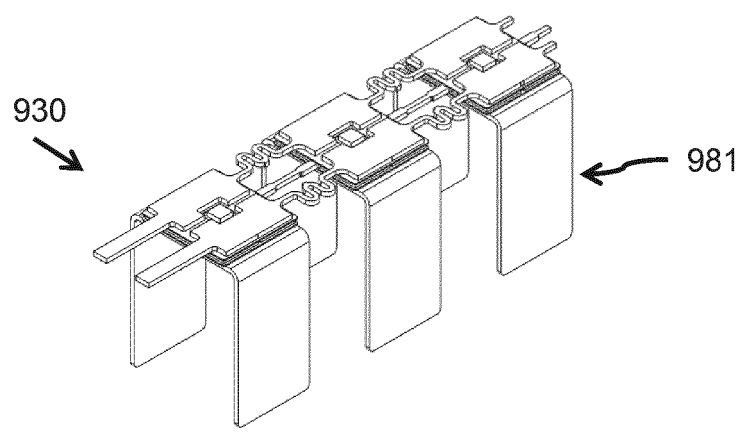
Figure 9C:
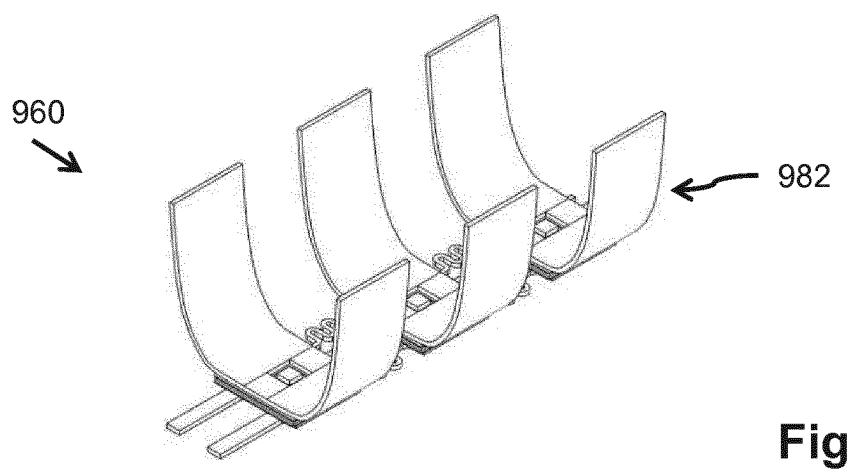

FIGS. 9a to 9c schematically present three dimensional views of embodiment of elongated lighting assemblies 900, 930, 960 having differently shaped further metal elements 980, 981, 982. As shown in FIG. 9a, the further metal element 980 of the earlier discussed stacks of layers of the light emitter islands is a flat piece of metal of which an area is brought in contact with the further electrically isolating layer. The position of the further metal element 980 in the stacks of the light emitter islands has been discussed in the context of, for example, FIG. 6. As shown in FIG. 9b, the further metal element 981 may be bent in a U shape, wherein a central part of the U shape is relatively flat and brought in contact with the further electrically isolating layer and wherein the legs of the U shape are relatively straight and are arranged in a direction away from the light emitter island (which means that when light is emitted by the light emitter, the light is emitted into a first direction and the legs of the further metal element 981 extend in a second direction opposite the first direction). The position of the further metal element 981 in the stacks of the light emitter islands has been discussed in the context of, for example, FIG. 6. As shown in FIG. 9c, the further metal element 982 may be bent in a U shape, wherein a central part of the U shape is relatively flat and brought in contact with the further electrically isolating layer and wherein the legs of the U shape are curved such that the further metal element 982 forms a curved mirror that acts as an optical element that influences the light beam emitted by the light emitters provided on the electrodes of the light emitter island. The position of the further metal element 982 in the stacks of the light emitter islands has been discussed in the context of, for example, FIG. 7.

Figure 13:
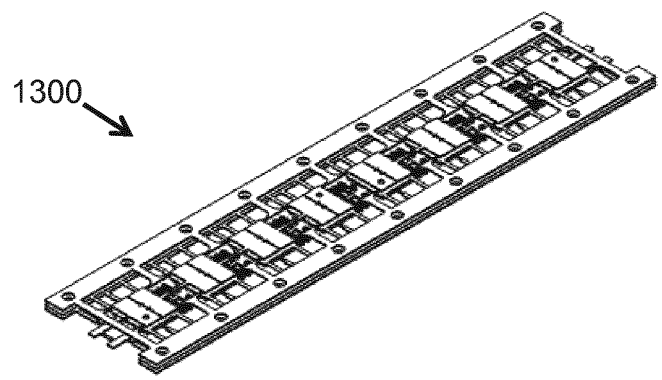
Figure 14:
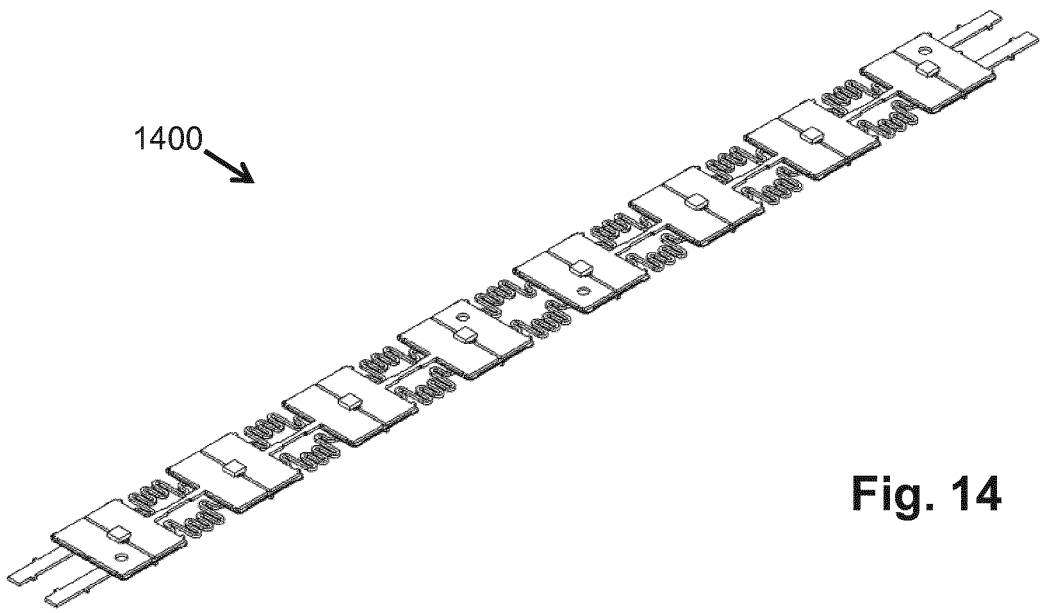
Figure 15:
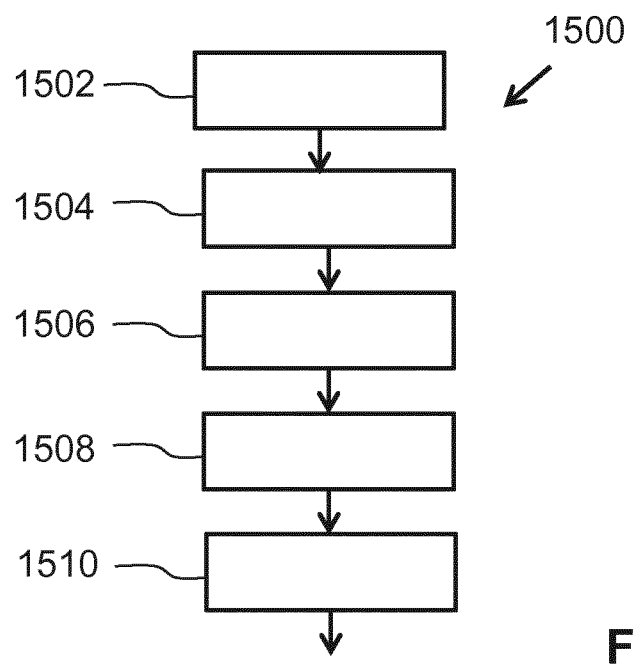

FIGS. 10 to 14 schematically present different intermediate states of a method of manufacturing an elongated lead frame, and FIG. 15 schematically presents a method 1500 of manufacturing an elongated lead frame. The method 1500 of manufacturing an elongated lead frame comprises i) providing 1502 a first patterned layer 1006 of an electrically conductive material, the first patterned layer 1006 comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming an electrically conductive connection in between the pairs of neighboring first structures; ii) providing 1504 a second patterned layer 1004 of an electrically isolating material, the second patterned layer 1004 comprising second structures for a second layer of the stack of the light emitter islands, the second patterned layer is provided on top of the first patterned layer; iii) providing 1506 a third patterned layer 1002 of an electrically conductive material, the third patterned layer 1002 comprising third structures for a third layer of the stack of the light emitter islands, the third pattern layer is provided on top of a stack formed by the first patterned layers and the second patterned layer. The method 1500 may also comprise stages to align the first patterned layer, the second patterned layer and the third patterned layer such that elements of the stacks are aligned correctly to each other.

Figure 10:
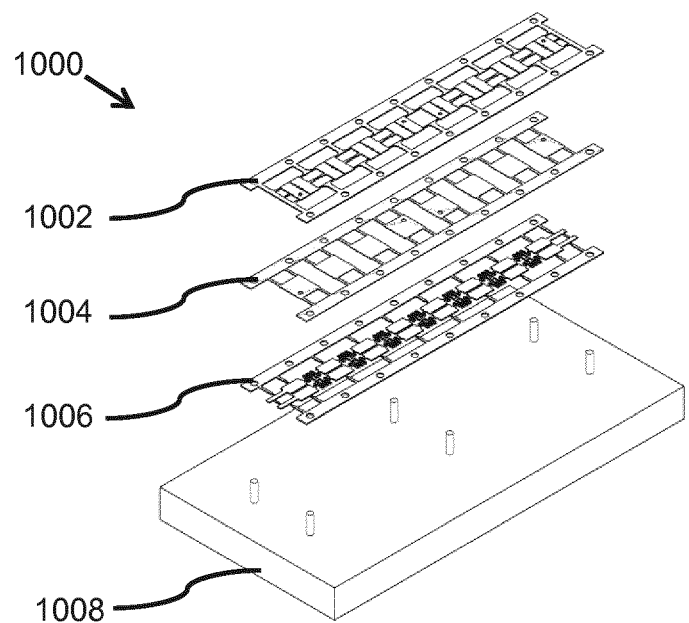

In FIG. 10 an exploded view 1000 of an intermediate state 1100 of the method 1500 of manufacturing the elongated lead frame is provided. In the exploded view 1000 a base press block 1008 is provided that has some protruding elements. Another term for the base press block 1008 is mounting jig. First the first patterned layer 1006 is placed on the base press block 1008 and such that holes in the first patterned layer 1006 engage with the protruding elements. The first patterned layer 1006 has the elements that will later form in the elongated lead frame the two electrically conductive tracks. In order to have a first patterned layer 1006 that can be handled easily, the first patterned layer 1006 also comprises additional elements that are often termed tie bar structures that provide a structure to the first patterned layer 1006 and that keep together the portions that will later form the two electrically conductive tracks. The holes that engage with the protrusions of the base press block 1008 are provided in the tie bar structures. On top of the first patterned layer 1006 is placed the second patterned layer 1004. Also the second patterned layer 1004 has tie bar structures that have some holes to engage with the protrusions of the base press block 1008. The holes and protrusions have also the function of aligning the second patterned layer 1006 with respect to the first patterned layer 1006. On top of the second patterned layer 1004 is placed the third patterned layer 1002 that also comprises tie bar structures that have holes to engage with the protrusions of the base press block 1008.

Figure 11:
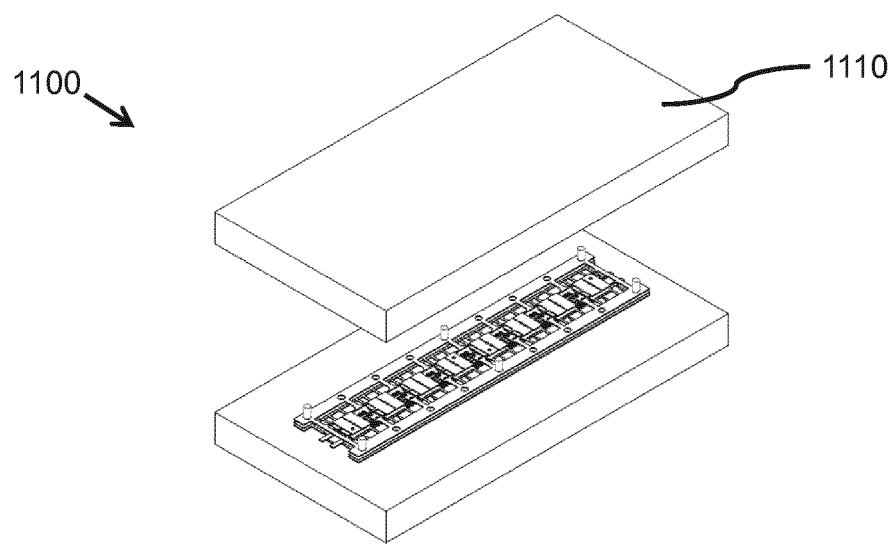

FIG. 11 shows how the first patterned layer 1006 to the third patterned layer 1002 are placed as a stack on the base press block and subsequently a top press block 1110 is placed on top of the stack of the first patterned layer 1006 to the third patterned layer 1002. The top press block 1110 also has holes that engage with the protrusions of the base press block.

Figure 12:
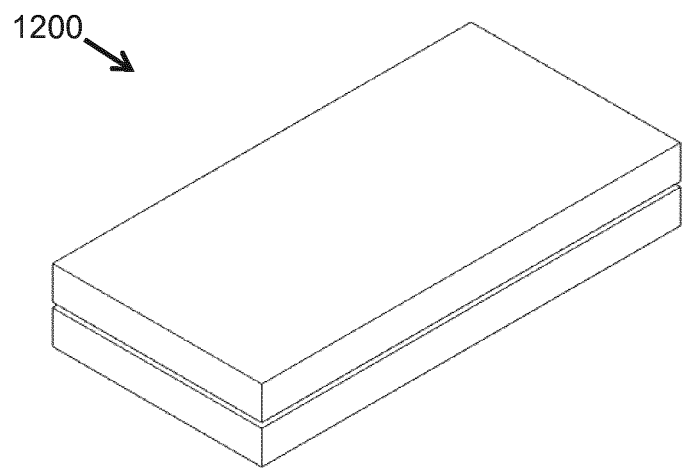

FIG. 12 shows an intermediate state 1200 of the method 1500 of manufacturing the elongated lead frame. This intermediate state 1200 is obtained after the stage of applying 1508 a hot press lamination process to the stack of the first patterned layer, the second patterned layer and the third patterned layer. In the stage of applying 1508 the hot press lamination process, the base press block and the top press block are heated to a certain temperature, for example, 180-200 degrees Celsius and the said press blocks are pressed together. The applied pressure may be 14-28 Kg/cm². The temperature and the pressure may be applied up to 2 hours. The temperature, the pressure and the time during which the temperature and the pressure is applied may deviate depending on the used materials and the quality of the required lamination.

FIG. 13 shows an intermediate state 1300 of the method 1500 of manufacturing the elongated lead frame. After applying the hot press process and after moving the top press block and the bottom press block, a stack of layers is obtained wherein the layers are well-fastened to each other. In a final step of the method 1500 of manufacturing the elongated lead frame, the stage of removing 1510 tie bar structures of the first patterned layer, the second layer and/or the third patterned layer is applied.

In an embodiment, a method of manufacturing an elongated lighting assembly is provided that comprises the method 1500 of manufacturing an elongated lead frame. The method of manufacturing an elongated lighting assembly also comprises the stage of providing solid state light emitters to the structures of the third layer of the stack of the light emitter islands. After this stage, the elongated lighting assembly 1400 presented in FIG. 14 is obtained.

It is to be noted that in the above process also the further electrically isolating layer and the further metal element may be provided to the elongated lead frame by means of the same sort of processing steps.

It is to be noted that the above process is not necessarily only applied by using separate sheets that are placed in between press blocks. The above process may also be provided as s continuous process in which the patterned layers are provided on a roll and that a reel-to-reel process is used wherein the patterned layers are continuously provided by the rolls and wherein, at a specific location, the layers are locally heated and pressed together.

In summary, this documents provides an elongated lead frame for a plurality of solid state light emitters, an elongated lighting assembly and a method of manufacturing an elongated lead frame. The elongated lead frame comprises a plurality of light emitter islands and two electrically conductive tracks. The plurality of light emitter islands comprising two electrodes for receiving one of the plurality of solid state light emitters and for providing power to the one of the plurality of solid state light emitters. The light emitter islands having a rigid structure. The two electrically conductive tracks are arranged along the elongated lead frame for transporting power for the plurality of solid state light emitters. At least one of the two electrically conductive tracks comprises winded portions in between pairs of neighboring light emitter islands for obtaining a flexible electrically conductive track in between the pairs of neighboring light emitter islands.

Further embodiments of the invention are disclosed in the subsequent clauses:

1. An elongated lead frame for a plurality of solid state light emitters, the elongated lead frame comprising:

a plurality of light emitter islands comprising two electrodes for receiving a respective one of the plurality of solid state light emitters and for providing power to the respective one of the plurality of solid state light emitters, the light emitter islands having a rigid structure, two electrically conductive tracks being arranged along the elongated lead frame for transporting power for the plurality of solid state light emitters, wherein at least one of the two electrically conductive tracks comprises winded portions in between pairs of neighboring light emitter islands for obtaining a flexible electrically conductive track in between the pairs of neighboring light emitter islands.

2. An elongated lead frame according to clause 1, wherein also another one of the two electrically conductive tracks comprises winded portions in between the pairs of neighboring light emitter islands for obtaining a further flexible electrically conductive track in between the pairs of neighboring light emitter islands.

3. An elongated lead frame according to any one of the preceding clauses, wherein, in between the pairs of neighboring light emitter islands, the two electrically conductive tracks are not mechanically coupled to each other by means of a rigid material.

4. An elongated lead frame according to any one of the preceding clauses, further comprising a plurality of series electrically conductive wires, each series electrically conductive wire being coupled between a first light emitter island and a neighboring second light emitter island for providing an electrical connection in a series arrangement of a subset of the plurality of solid state light emitters, the series electrically conductive wires being arranged near or at a longitudinal central axis of the elongated lead frame.

5. An elongated lead frame according to clause 4, wherein the plurality of series electrically conductive wires have a central portion at which a width of said series electrically conductive wires is about equal to a height of said series electrically conductive wires.

6. An elongated lead frame according to any one of the preceding clauses, wherein the plurality of the light emitter islands are formed by stacks of a first layer comprising first metal areas, an electrically isolating layer and a second layer comprising second metal areas, wherein a first one of the first metal areas is part of a first one of the two electrically conductive tracks, a second one of the first metal areas is part of a second one of the two electrically conductive tracks, and wherein at least two of the second metal areas form the two electrodes for receiving one of the plurality of solid state light emitters.

7. An elongated lead frame according to clause 6, wherein the first metal areas are electrically isolated from each other by a first elongated area extending in a first direction within the first layer and the second metal areas are electrically isolated from each other by a second elongated area extending in a second direction within the second layer, the second direction being different from the first direction.

8. An elongated lead frame according to clause 6 or 7 when directly or indirectly referring to clause 4, wherein each electrically conductive wire of the plurality of series electrically conductive wires is coupled between a respective one of the second metal areas of the first light emitter island and a respective one of the second metal areas of the neighboring second light emitter island.

9. An elongated lead frame according to any one of the clauses 6 to 8 comprising a plurality of through holes in the electrically isolating layer of the stacks of a subset of the plurality of light emitter islands, the through holes being filled with an electrically conductive material for electrically connecting one of the second metal areas with one of the first metal areas.

10. An elongated lead frame according to clause 9, wherein the electrically conductive material of a subset of the through holes is ohmic for creating a series resistor.

11. An elongated lead frame according to any one of the clauses 6 to 9, wherein the stacks of the plurality of the light emitter islands comprise a further electrically isolating layer and a further metal element, the further electrically isolating layer is provided in between the further metal element and one of the first layer and second layer, the further metal elements are one of
a flat metal element of which an area is coupled to the further electrically isolating layer,
a metal element bended in a U shape having in between the legs of the U shape a flat area that is coupled to the further electrically isolating layer.

12. An elongated lead frame according to any one of the clauses 6 to 11, wherein at least one of the electrically isolating layer and the further electrically isolating layer is heat conductive.

13. An elongated lighting assembly comprising:
a plurality of solid state light emitters,
an elongated lead frame according to any one of the clauses 1 to 12, wherein each one of the plurality of solid state light emitters is arranged at the two electrodes of a respective one of the light emitter islands.

14. An elongated lighting assembly according to clause 13 further comprising a light transmitting flexible material encapsulating the elongated lead frame provided with the plurality of solid state light emitters, wherein
the light transmitting flexible material is shaped in a bar-shape or a rod-shape,
the light transmitting flexible material is also provided in a space in between pairs of neighboring light emitter islands in between the two electrically conductive tracks, and
optionally, when directly or indirectly referring to clause 11, the further metal element partially protrudes out of the light transmitting flexible material.

15. Method of manufacturing an elongated lead frame for a plurality of solid state light emitters, the method comprising:
providing a first patterned layer of an electrically conductive material, the first patterned layer comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures, providing a second patterned layer of an electrically isolating material, the second patterned layer comprising second structures for a second layer of the stack of the light emitter islands, the second patterned layer is provided on top of the first patterned layer,
providing a third patterned layer of an electrically conductive material, the third patterned layer comprising third structures for a third layer of the stack of the light emitter islands, the third pattern layer is provided on top of a stack formed by the first patterned layers and the second patterned layer,
applying a hot press lamination process to a stack of the first patterned layer, the second patterned layer and the third patterned layer,
removing tie bar structures of the first patterned layer, the second layer, and/or the third patterned layer.

It is noted, that in this document the word 'comprising' does not exclude the presence of other elements or steps than those listed and the word 'a' or 'an' preceding an element does not exclude the presence of a plurality of such elements, that any reference signs do not limit the scope of the claims. Further, the invention is not limited to the embodiments, and the invention lies in each and every novel feature or combination of features described above or recited in mutually different dependent claims.

The invention claimed is:
1. An elongated lead frame for a plurality of solid state light emitters, the elongated lead frame comprising:
a first patterned layer of an electrically conductive material, the first patterned layer comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures,
a second patterned layer of an electrically isolating material, the second patterned layer comprising second structures for a second layer of the stack of the light emitter islands, the second patterned layer is provided on top of the first patterned layer and the second structures are provided on the first structures,
wherein the light emitter islands have a rigid structure,
wherein in between pairs of neighboring light emitter islands the first electrically conductive track is not mechanically coupled to the winded portion of the second electrically conductive track by means of a rigid material; and
a third patterned layer of an electrically conductive material, the third patterned layer comprising third structures for a third layer of the stack of the light emitter islands, the third pattern layer is provided on top of a stack formed by the first patterned layers and the second patterned layer,
wherein the third structures are provided on the second structures at an opposite surface of the second structures than the surface to which the first structures are provided.

2. An elongated lead frame according to claim 1, wherein also another one of the two electrically conductive tracks comprises winded portions in between the pairs of neighboring light emitter islands for obtaining a further flexible electrically conductive track in between the pairs of neighboring light emitter islands.

3. An elongated lead frame according to claim 1, wherein the third patterned layer of an electrically conductive material comprises a plurality of series electrically conductive wires, each series electrically conductive wire being coupled between a first one of the third structure and a neighboring second one of the third structures for providing an electrical connection in a series arrangement of a subset of the plurality of solid state light emitters, the series electrically conductive wires being arranged near or at a longitudinal central axis of the elongated lead frame.

4. An elongated lead frame according to claim 3, wherein the plurality of series electrically conductive wires have a central portion at which a width of said series electrically conductive wires is about equal to a height of said series electrically conductive wires.

5. An elongated lead frame according to claim 1, wherein at least two of the third structures form electrodes for receiving one of the plurality of solid state light emitters.

6. An elongated lead frame according to claim 5, wherein the first structures for a first layer of a stack of light emitter islands are electrically isolated from each other by a first elongated area extending in a first direction within the first layer and the third structures for a third layer of the stack of the light emitter islands are electrically isolated from each other by a second elongated area extending in a second direction within the third layer, the second direction being different from the first direction.

7. An elongated lead frame according to claim 5, comprising a plurality of through holes in the second patterned layer, the through holes being filled with an electrically conductive material for electrically connecting one of the third structures with one of the first structures.

8. An elongated lead frame according to claim 7, wherein the electrically conductive material of a subset of the through holes s ohmic for creating a series resistor.

9. An elongated lighting assembly according to claim 5, wherein each one of the plurality of solid state light emitters is arranged at the two electrodes of a respective one of the light emitter islands.

10. An elongated lighting assembly according to claim 9 further comprising a light transmitting flexible material encapsulating the elongated lead frame provided with the plurality of solid state light emitters, wherein
the light transmitting flexible material is shaped in a bar-shape or a rod-shape,
the light transmitting flexible material is also provided in a space in between pairs of neighboring light emitter islands in between the two electrically conductive tracks.

11. An elongated lead frame for a plurality of solid state light emitters, the elongated lead frame comprising:
a first patterned layer of an electrically conductive material, the first patterned layer comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures,
a second patterned layer of an electrically isolating material, the second patterned layer comprising second structures for a second layer of the stack of the light emitter islands, the second patterned layer is provided on top of the first patterned layer and the second structures are provided on the first structures,
wherein the light emitter islands have a rigid structure,
wherein in between pairs of neighboring light emitter islands the first electrically conductive track is not mechanically coupled to the winded portion of the second electrically conductive track by means of a rigid material; and
wherein elongated lead frame further comprises a further electrically isolating layer and a further metal element, the further electrically isolating layer is provided in between the further metal element and one of the first patterned layer and third patterned layer, the further metal elements are one of
a flat metal element of which an area is coupled to the further electrically isolating layer,
a metal element bended in a U shape having in between the legs of the U shape a flat area that is coupled to the further electrically isolating layer.

12. An elongated lead frame according to claim 11, wherein at least one of the second patterned layer and the further electrically isolating layer is heat conductive.

13. Method of manufacturing an elongated lead frame for a plurality of solid state light emitters, the method comprising:
providing a first patterned layer of an electrically conductive material, the first patterned layer comprising two electrically conductive tracks that comprise first structures for a first layer of a stack of light emitter islands and two electrically conductive connections between the first structures, at least one of the electrically conductive tracks comprises in between pairs of neighboring first structures a winded portion for forming a flexible electrically conductive connection in between the pairs of neighboring first structures,
providing a second patterned layer of an electrically isolating material, the second patterned layer comprising second structures for a second layer of the stack of the light emitter islands, the second patterned layer is provided on top of the first patterned layer; and
providing a third patterned layer of an electrically conductive material, the third patterned layer comprising third structures for a third layer of the stack of the light emitter islands, the third pattern layer is provided on top of a stack formed by the first patterned layers and the second patterned layer.

\* \* \* \* \*